(12) United States Patent
Uchida

(10) Patent No.: US 6,305,002 B1
(45) Date of Patent: Oct. 16, 2001

(54) SEMICONDUCTOR INTEGRATED CIRCUIT HAVING THEREON ON-CHIP CAPACITORS

(75) Inventor: Kohei Uchida, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/204,077

(22) Filed: Dec. 3, 1998

(30) Foreign Application Priority Data

Dec. 4, 1997 (JP) .................................................. 9-334308

(51) Int. Cl.$^7$ ...................................................... G06F 17/50
(52) U.S. Cl. ................................................. 716/12; 716/10
(58) Field of Search .......................................... 716/1–21

(56) References Cited

U.S. PATENT DOCUMENTS

| | | | |
|---|---|---|---|
| 4,615,011 | * 9/1986 | Linsker | 716/13 |
| 5,272,600 | 12/1993 | Carey | 361/792 |
| 5,457,064 | * 10/1995 | Lee | 438/253 |
| 5,483,461 | * 1/1996 | Lee et al. | 716/14 |
| 5,822,214 | * 10/1998 | Rostoker et al. | 716/10 |
| 5,838,582 | * 11/1998 | Mehrotra et al. | 716/5 |
| 6,006,025 | * 12/1999 | Cook et al. | 716/14 |
| 6,028,990 | * 2/2000 | Shahani et al. | 716/8 |
| 6,035,111 | * 3/2000 | Suzuki et al. | 716/11 |
| 6,080,206 | * 11/2000 | Tadokoro et al. | 716/10 |
| 6,093,214 | * 7/2000 | Dillon | 716/17 |

FOREIGN PATENT DOCUMENTS

| | | | |
|---|---|---|---|
| 3-16260 | 1/1991 | (JP) | H01L/27/118 |
| 5-283531 | 10/1993 | (JP) | H01L/21/82 |
| 8-97214 | 4/1996 | (JP) | H01L/21/3205 |

OTHER PUBLICATIONS

Groeneveld ("A Multiple Layer Contour–Based Gridless Channel Router", IEEE Transactions on Computer–Aided Design, vol. 9, No. 12, Dec. 1990, pp. 1278–1288).*

Haruyama et al. ("Topological Channel Routing", IEEE Transactions on Computer–Aided Design, vol. 11, No. 10, Oct. 1992, pp. 1177–1197).*

Ker et al. ("On–chip ESD protection using capacitor–couple technique in 0.5–/spl mu/m 3–V CMOS technology", Proceedings of the Eight Annual IEEE International ASIC Conference and Exhibit, 1995, Sep. 18, 1995, pp. 135–138).*

Chen et al., ("On–chip decoupling capacitor optimization for high–performance VLSI design", 1995 International Symposium on VLSI Technology, Systems, and Applications, 1995, Proceedings of Technical Papers, May 31 1995, pp. 99–103).*

* cited by examiner

*Primary Examiner*—Matthew Smith
*Assistant Examiner*—Phallaka Kik
(74) *Attorney, Agent, or Firm*—Sughrue, Mion, Zinn, Macpeak & Seas, PLLC

(57) ABSTRACT

In the present invention, inside a large scale integrated circuit (LSI) chip, the on-chip capacitor to suppress a ground-bounce is arranged in a region below a first wiring group as well as between adjacent two wirings of, a second wiring group. Alternatively, the on-chip capacitor is arranged in a region obtained by combining the foregoing region with a region where the function block can not be arranged.

4 Claims, 5 Drawing Sheets

43 : UNUSED REGION OF INTERNAL REGION
41 : INTERNAL REGION
44 : FOUNDARY REGION
42 : I/O BUFFER REGION
45 : UNUSED REGION OF I/O REGION

SEMICONDUCTOR INTEGRATED CIRCUIT HAVING THEREON ON-CHIP CAPACITORS

BACKGROUND OF THE INVENTION

The present invention relates to a semiconductor integrated circuit having one or more on-chip capacitors thereon, a method of arranging elements formed therein, and a method of manufacturing the same.

In conventional large scale integrated circuits (LSI), there has been a problem that so-called "ground-bounce" occurs in power supply source trunk lines, due to the switching operation of transistors formed in the LSI, resulting in occurrence of delay and noises. Accordingly, in order to control the ground-bounce, countermeasures such as provisions of capacitors on the package of an LSI and capacitors within an LSI, which are called on-chip capacitors composed of PN junction capacitance or gate capacitance, have been adopted.

The on-chip capacitor itself is made of an aluminum wiring, so that an on-chip capacitor has been heretofore disposed at a peripheral portion of a chip where it does not hinder the disposition of the other wirings. Referring FIG. 8, in conventional LSI, in order to avoid the occurrence of a situation where an on-chip capacitor hinders the disposition of the wirings or limits the arrangement of function blocks, the on-chip capacitor has not been disposed near the transistors causing the ground-bounce. Instead of near the transistors, the on-chip capacitor has been disposed in a spot such as a unused area 43 in an internal region 41 in the LSI where no function block is arranged, a boundary area 44 between the internal region 41 and an Input-Output (I/O) region 42, and a unused area 45 in the I/O region 42 where no I/O buffer is arranged.

In such prior art, since the on-chip capacitor for controlling the ground-bounce is disposed apart from the transistors which actually causes the ground-bounce, there has been a problem that the on-chip capacitor exhibits a less effect for controlling the ground-bounce.

Furthermore, a large capacitance for controlling the ground-bounce, that is, a large on-chip capacitor, is needed, resulting in a problem that the chip mounting the large in-chip capacitor becomes larger.

Still furthermore, when it is intended to dispose an on-chip capacitor in the internal region, wiring is hindered or the wiring length between the function blocks increases because of limitation to the function block arrangement, so that there has been a problem that the performance of the chip is deteriorated.

In the prior art, it is required for an LSI designer to find out an unused region without the aid of any machine and to arrange an on-chip capacitor without the aid of any machine, so that there has been a problems that designing is not easy.

Moreover, since, in the vicinity of the intersection of a power supply source wiring and a ground wiring within a chip, the wiring connection of function blocks and the like is difficult due to the presence of these wirings, the vicinity of such intersection has not been used.

SUMMARY OF THE INVENTION

An object of the present invention is to provide a semiconductor integrated circuit in which an on-chip capacitor is built in and a method of manufacturing the same, without reducing its performance and integration density.

According to a first aspect of the present invention, there is provided a semiconductor integrated circuit of a standard cell type which comprise: a first wiring group composed of a plurality of first wirings running in a first direction; a second wiring group positioned under said first wiring group, the second wiring group being composed of a plurality of second wirings which run in a second direction different from said first direction; and one or more on-chip capacitors provided in a region which is under a predetermined one of said first wirings and is between two adjacent wirings of said second wirings.

According to a second aspect of the present invention, there is provided method of manufacturing the above-mentioned semiconductor integrated circuit comprises: a first arrangement step of designating said region as an arrangement inhibition region, and arranging one or more function blocks in the other region; a step of canceling the designation of said region having been designated as said arrangement inhibition region in said first arrangement step, after completion of said first arrangement step; and a second arrangement step of arranging one or more on-chip capacitors in both said region of which the designation as said arrangement inhibition region has been canceled and a region which was not used in said first arrangement step.

BRIEF DESCRIPTION OF THE DRAWINGS

Other features and advantages of the present invention will become apparent from the following description when taken in conjunction with the accompanying drawings, in which.

DETAILED DESCRIPTION OF THE PREFERRED EMBODIMENTS

Embodiments of the semiconductor integrated circuit of the present invention which is of a standard cell type in detail below will be described with reference to the accompanying drawings.

Generally, each two adjacent wiring layers of conventional wiring layers in an LSI has signal lines which run in a direction normal to the direction in which signal lines in the other wiring layer run. Therefore, if signal wirings in one of the two adjacent wiring layers run in the horizontal direction, signal wirings in the other wiring layer run in the vertical direction. Each wiring layer has a power source wiring and a ground wiring.

Figure 1:
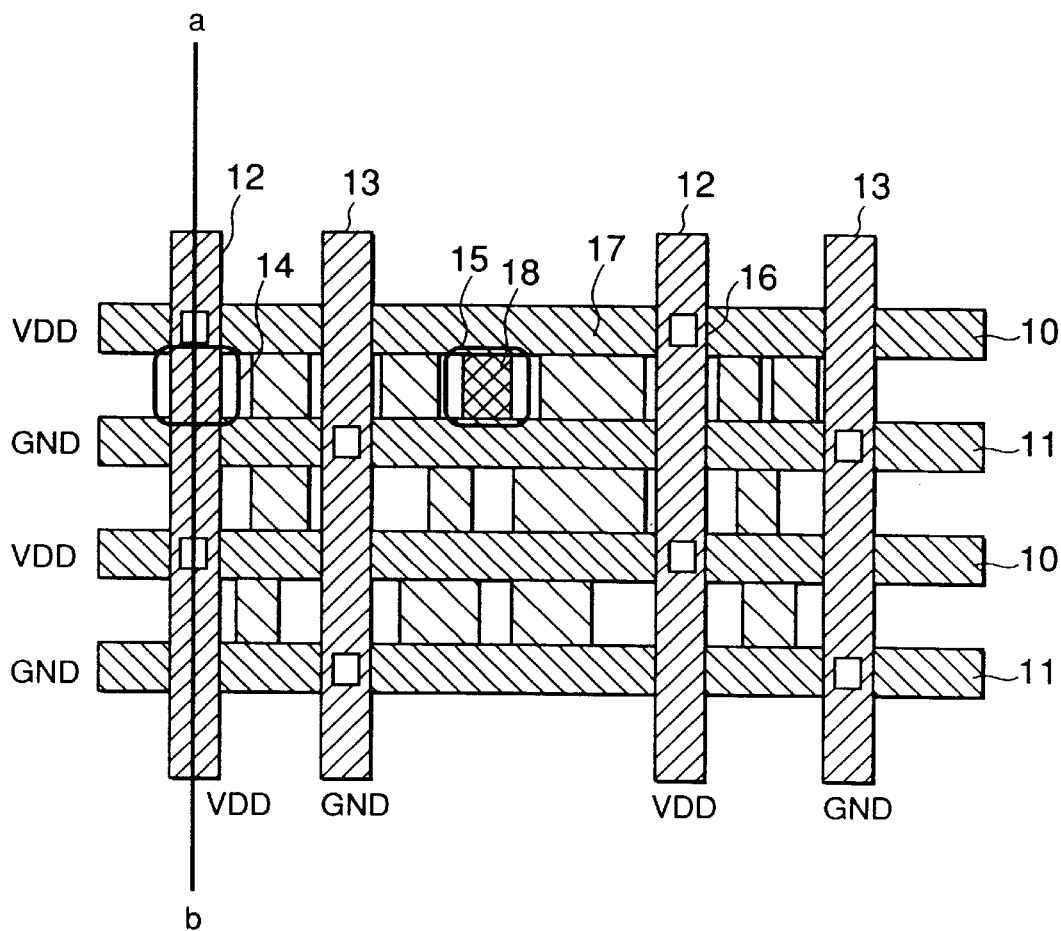
FIG. 1 shows a plan view of a first embodiment of the present invention.

Referring to FIG. 1, a first embodiment of the semiconductor integrated circuit of the present invention comprises a first wiring layer including a horizontal direction power source wiring 10 and a horizontal direction ground wiring 11; and a second wiring layer including a vertical direction power source wiring 12 and a vertical direction ground wiring 13. The horizontal direction power source wiring 10 and the vertical direction power source wiring 12 are connected to each other by a via-holes 16. The horizontal direction ground wiring 11 and the vertical direction ground wiring 13 are connected to each other by via-holes 16 as well. Function blocks 17 are disposed in areas surrounded by these wirings. A cross section taken along a line a-b in FIG. 1 is shown in FIG. 2.

Figure 2:
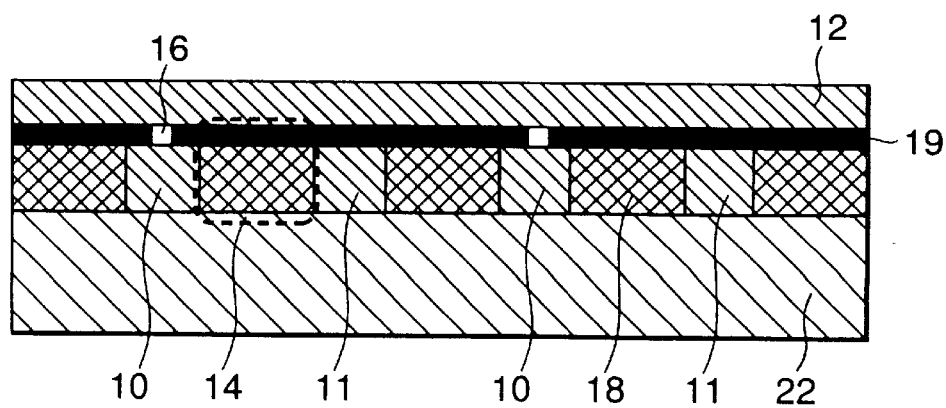
FIG. 2 shows a cross-sectional view taken along a line a-b in FIG. 1.

Referring to FIGS. 1 and 2, regions 14, are on a substrate 22, right under one of the vertical direction wirings 12 and 13 and between the horizontal direction wirings 10 and 11. Any of the regions 14 has not been used as a place where a function block or the like is disposed, because the power source wiring and the ground wiring interrupt arrangement of an function block. For this reason, in an internal region an on-chip capacitor 18 is arranged only in a unused region 15.

In the present invention, by dealing with the function block and the on-chip capacitor separately, the on-chip capacitor 18 is arranged in the region 14.

With respect to a method for arranging an on-chip capacitor, there are the following two methods utilizing a CAD (Computer Aided Design) system. In either method, it is assumed that an internal region in an LSI is logically divided into small areas called sites as shown in FIG. 3.

Figure 3:
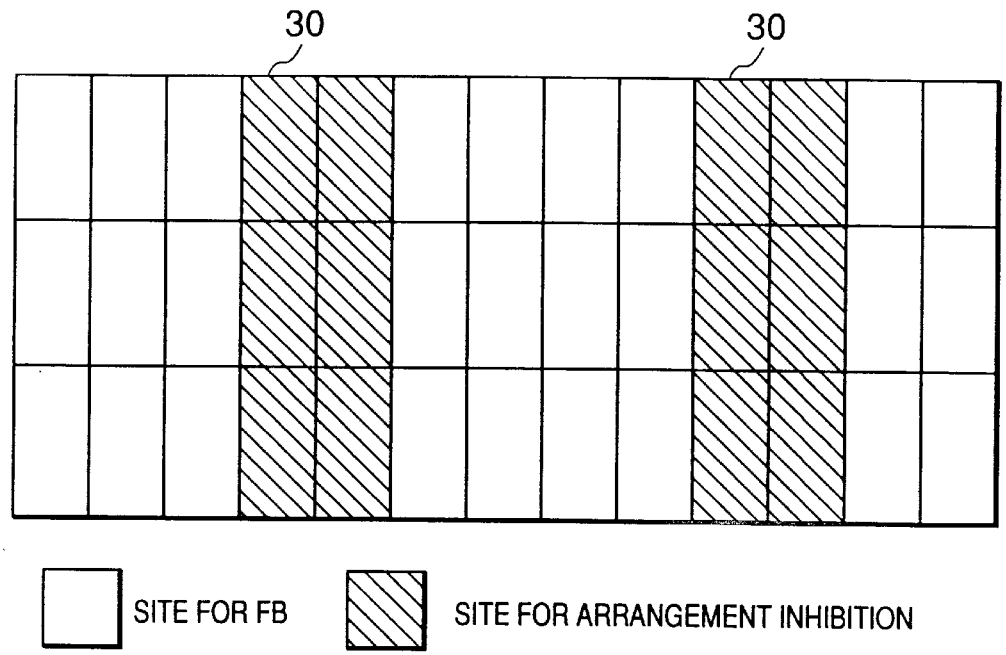
FIG. 3 is a diagram for explaining a first arrangement method for on-chip capacitors.
Figure 4:
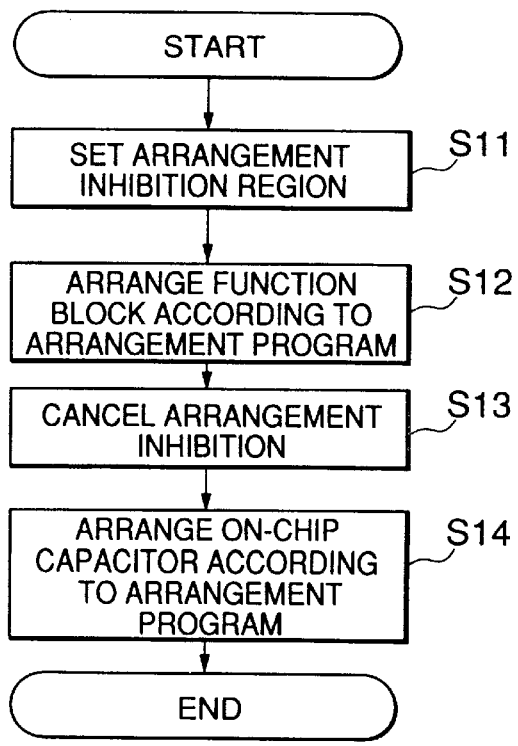
FIG. 4 is a flowchart showing the first arrangement

FIG. 3 and FIG. 4 are drawings for explaining a first method. In the first method, an arrangement program in the CAD system defines a site group 30 constituting the region 14 under the vertical direction power source wiring 12 or the vertical direction ground wiring 13 as an arrangement inhibition region at the time of function block arrangement (step S11 in FIG. 4). Subsequently, the arrangement program arranges the function blocks 17 in arrangeable sites which are not defined as the arrangement inhibition region in the step S11 (step S12). More specifically based on the arrangement conditions and the connection conditions of the function blocks, the arrangement program sequentially arranges the function block 17, thereby filling the sites. Then, after completion of the arrangements for all of the function blocks, the arrangement inhibition state of the site group 30 is canceled (step S13). Next, the arrangement of the on-chip capacitors 18 is performed according to the arrangement program (step S14). Thus, the on-chip capacitors 18 are arranged on the site group 30 (which has been in the arrangement inhibition state, that is, the region 14) and the unused region 15.

Figure 5:
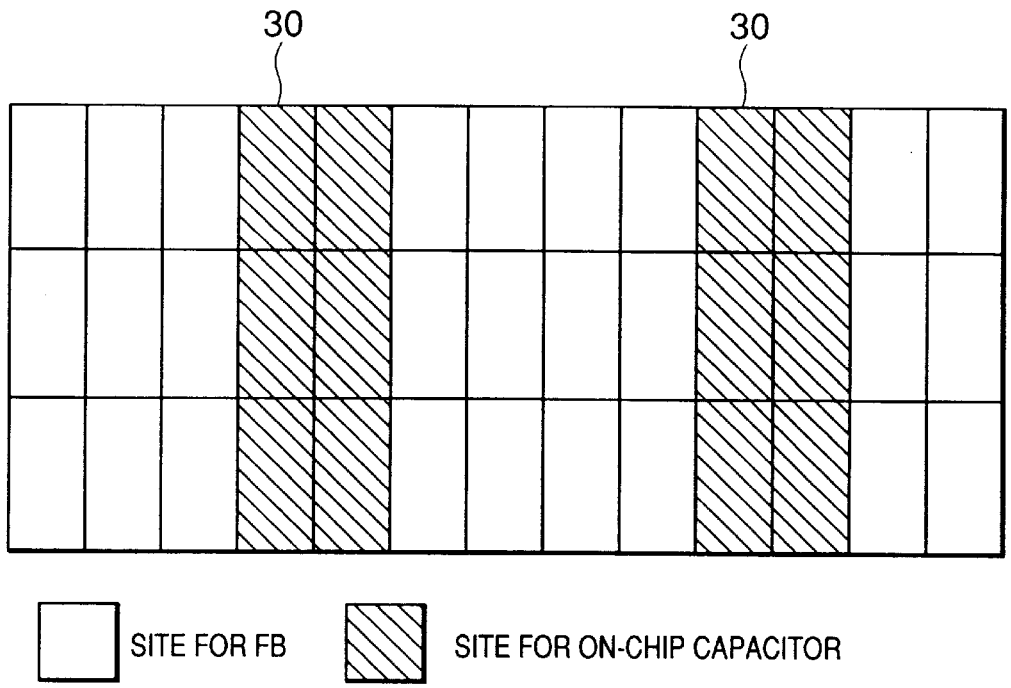
FIG. 5 is a diagram for explaining a second arrangement method for on-chip capacitors.
Figure 6:
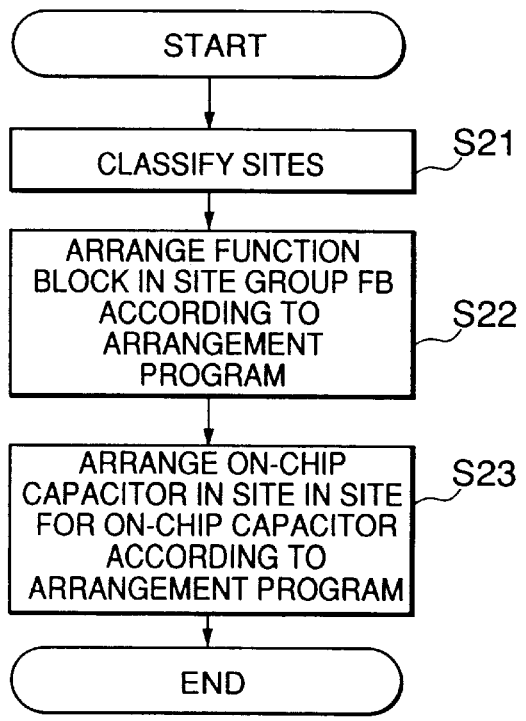
FIG. 6 shows a flowchart of the second arrangement method.

FIG. 5 is for explaining a second arrangement method. In the second arrangement method, sites are classified into two groups in advance depending on whether they lie in the region 14 under the vertical direction power source wiring 12 or the vertical direction ground wiring 13, or in other regions than the region 14 (step S21 in FIG. 6). In FIG. 5, a site group lying in the other regions than the regions 14 in which the function blocks 17 can be arranged is canceled a function block (FB) site group, and the site group 30 lying the region 14 is referred to as an on-chip capacitor site group. Then, the arrangement program actually arranges the function blocks 17 in the FB site group (step S22). After completion of the arrangements of all the function blocks, the arrangement program then arranges the on-chip capacitors 18 in the on-chip capacitor site group (step S23).

As described above, according to the first embodiment of the present invention, the arrangement program can easily arrange the on-chip capacitors 18 in the region 14 and the unused region 15 under the vertical direction power source wiring 12 or the vertical direction ground wiring 13.

Next, a second embodiment of the present invention will be described.

Figure 7:
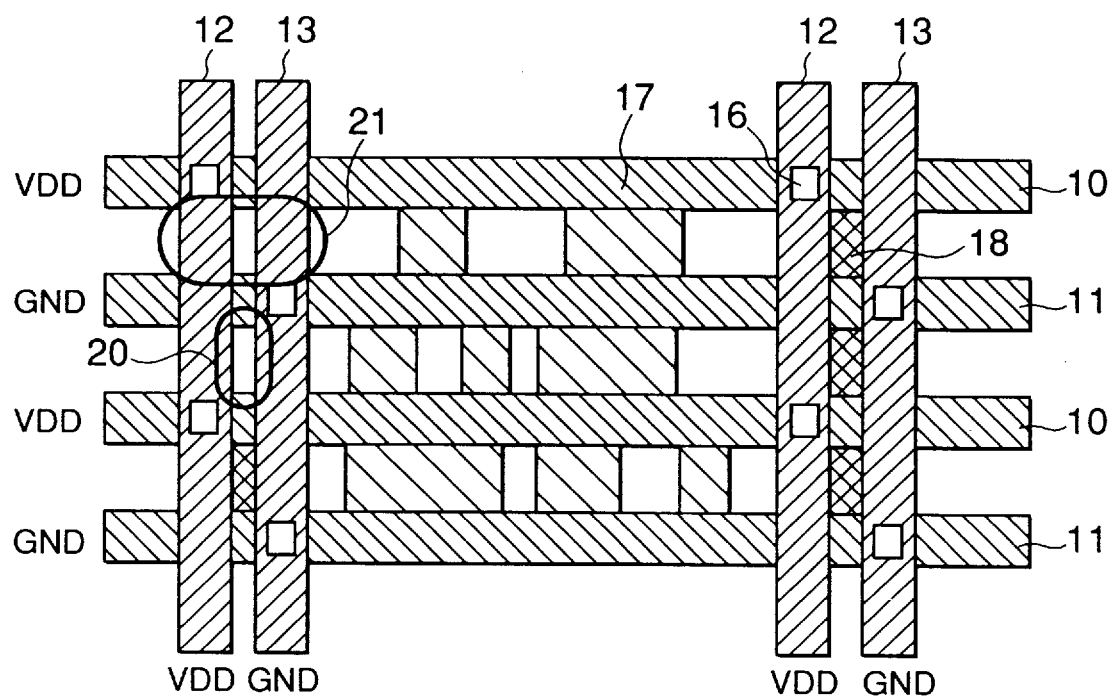
FIG. 7 shows a plan view showing a second embodiment of the present invention.
Figure 8:
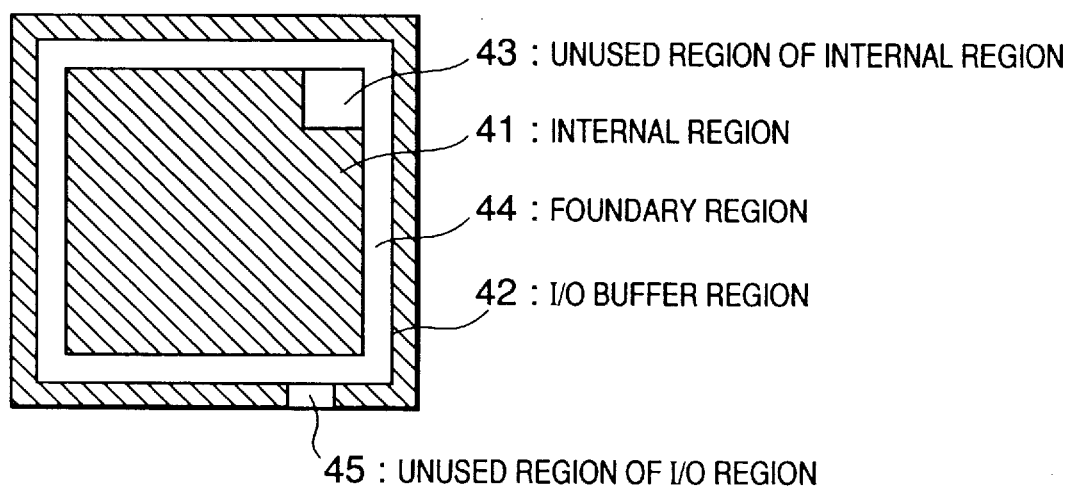
FIG. 8 shows a plan view of a conventional LSI chip.

Referring to FIG. 7, the second embodiment of the present invention is applied to the case where the function blocks 17 cannot be arranged in a region 20 between the vertical direction power source wiring 12 and the vertical direction ground wiring 13 because the region 20 is small. In this case, since the function blocks 17 are not arranged in the region 20 between the vertical direction power source wiring 12 and the vertical direction ground wiring 13, the region 20 is utilized for the in-chip capacitors. Specifically, the region 20 is combined with the region 14 in the first embodiment into a region 21 used as an onchip capacitor arrangement region. Then, the arrangement program performs the arrangements of the function blocks 17 and the on-chip capacitors 18. The arrangements can be performed similarly to those in the first embodiment, so that an explanation of them is omitted.

As described above, according to the second embodiment of the present invention, by dealing with the region 21 obtained by combining the region 20 with the region 14 as an arrangement region for on-chip capacitors, a larger arrangement region can be secured.

While, in the above described embodiments of the present invention, the portion under the vertical direction power source wiring 12 and the vertical direction ground wiring 13 is used as an arrangement place, it is, as a matter of course, possible to provide an arrangement place under the horizontal direction power source wiring 10 or the horizontal direction ground wiring 11. Moreover, it is also possible to use the portions under the vertical and horizontal power source and ground wirings 10 to 13 as arrangement places.

Next, a manufacturing method for the semiconductor integrated circuit of the present invention will be described.

Figure 9A:
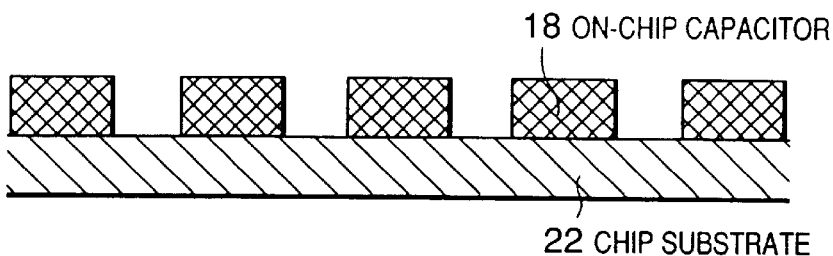
FIGS. 9A, 9B, 9C, 9D, 9E and 9F show manufacturing steps illustrating a manufacturing method for the semiconductor integrated circuit of the present invention.

First, as where shown in FIG. 9A, the on-chip capacitors 18 and the function blocks are formed on the substrate 22 according to the arrangement program, and a non-conductive body (hereinafter referred to as a fill cell) is formed on an unused region (step 1).

Figure 9B:
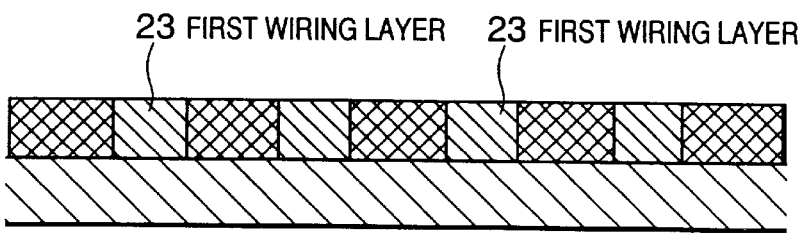

Subsequently, as shown in FIG. 9B, a metal film made of, for instance, aluminum is formed on the substrate 22 having being subjected to the processing of the step 1, and the metal film undergoes exposure using a mask which has a desired pattern. Thereafter, the metal film is etched, whereby a first wiring layer 23 including a horizontal direction power source wiring and a horizontal direction ground wiring is formed (step 2).

Figure 9C:
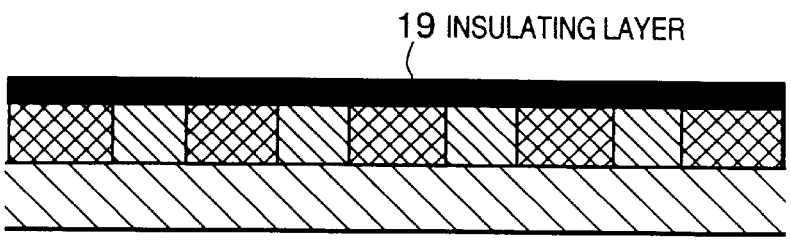

Furthermore, as shown in FIG. 9C, the substrate 22 structure after the step 2 is coated with an oxide film, and exposure and developing are performed, so that an insulating layer 19 is formed (step 3).

Figure 9D:
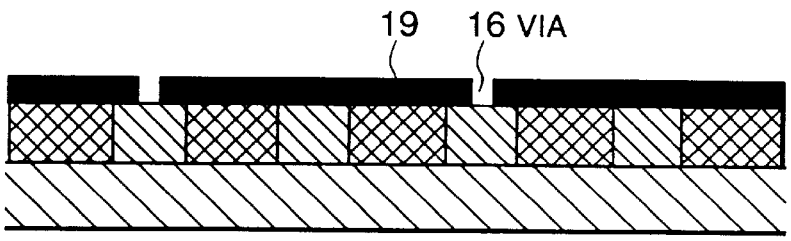

Next, as shown in FIG. 9D, holes are formed at predetermined positions in the insulating layer 19, and the holes are subjected to a plating processing so as to form metalized via-holes 16 (step 4).

Figure 9E:
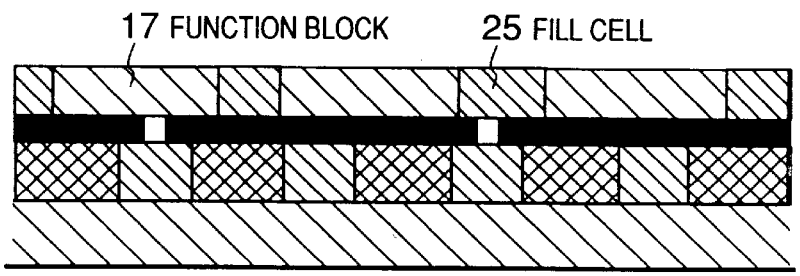

Subsequently, as shown in FIG. 9E, the function blocks 17 are formed on the insulating layer 19 formed in the step 3, and fill cells 25 are formed in an unused region so as to fill them (step 5).

Figure 9F:
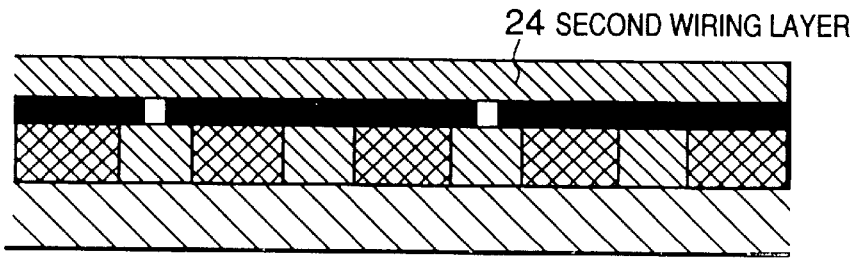

Next, as shown in FIG. 9F, a metal film made of, for example, aluminum is formed on the insulating layer 19 which was formed in the step 3, and the metal film is subjected to an exposing processing using a mask which has a desired pattern. The metal film which has been subjected to the exposing processing undergoes etching, whereby the second wiring 24 including both a vertical direction power source wiring and a vertical direction ground wiring is formed, which is provided at a position above the on-chip capacitor 18 (step 6).

Afterward, the steps 3, 4, 1, 3, 4 and 6, are repeatedly a predetermined number of times in this order.

As described above, in the embodiments of the present invention, the on-chip capacitors 18 is disposed at the region 14 under both the vertical direction power source wiring 12 and the vertical direction ground wiring 13 or at the region 21 under them and between them. Thus, the ground-bounce caused in the power source trunk line can be suppressed with on-chip capacitors of small capacitance. Moreover, by arranging the on-chip capacitors 18 in the internal region 41 of the LSI, an increase in the integration density of the circuit can be also achieved.

As described above, in the present invention, there is the advantage that the ground-bounce can be suppressed with on-chip capacitors of small capacitance. Moreover, the present invention also has the advantage that by arranging on-chip capacitors in the internal region in the LSI, the integration density of the LSI can be increased. Still moreover, the arrangement of on-chip capacitors according to an arrangement program becomes possible, so that the necessity for seeking an unused region and for providing a region exclusively used for on-chip capacitors is removed, resulting in an increase of the efficiency of design.

Although the preferred embodiments of the present invention have been described in detail, it should be understood that various changes, substitutions and alternations can be made therein without departing from spirit and scope of the inventions as defined by the appended claims.

What is claimed is:

1. An element arrangement method for a semiconductor integrated circuit comprising; first wirings composed of a plurality of power supply and ground wirings running in a first direction; and second wirings positioned under said first wirings, the second wirings being composed of a plurality of power supply and ground wirings which run in a second direction different from said first direction, said element arrangement method comprising:

a first arrangement step of designating first regions, each of which is under one of said first wirings and is between two adjacent wirings of said second wirings, as arrangement inhibition regions, and arranging one or more function blocks in second regions being between two adjacent wirings of said second wirings except for said first regions;

a step of canceling the designation of said first regions having been designated as said arrangement inhibition regions in said first arrangement step, after completion of said first arrangement step; and a second arrangement step of arranging one or more on-chip capacitors in both said first regions of which the designation as said arrangement inhibition regions has been canceled and unused regions of second regions which were not used in said first arrangement step.

2. An element arrangement method for the semiconductor integrated circuit comprising; first wirings composed of a plurality of power supply and ground wirings running in a first direction; second wirings positioned under said first wirings, the second wirings being composed of a plurality of power supply and ground wirings which run in a second direction different from said first direction; first regions being below one of said first wirings and being between two adjacent wirings of said second wirings; and second regions being between two adjacent regions of said first regions and being between two adjacent wirings of said second wirings, each second region being smaller than a function block, said element arrangement method comprising:

a first arrangement step of designating third regions, which consist of said first regions and said second regions, as arrangement inhibition regions and arranging one or more function blocks in other regions being between two adjacent wirings of said second wirings except for said first regions;

a step of canceling the designation of said third regions as said arrangement inhibition regions in the first arrangement step after completion of said first arrangement step; and a second arrangement step of arranging one or more on-chip capacitors in both said third regions and unused regions of said other regions which were not used in said first arrangement step.

3. An element arrangement method for a semiconductor integrated circuit comprising; first wirings composed of a plurality of power supply and ground wirings running in a first direction; and second wirings positioned under said first wirings, the second wiring group being composed of a plurality of power supply and ground wirings which run in a second direction different from said first direction, said element arrangement method comprising:

a step of designating first regions, each of which is under one of said first wirings and is between two adjacent wirings of said second wirings, as sites for an on-chip capacitor where on-chip capacitors are to be arranged and second regions being between two adjacent wirings of said second wirings except for said first regions as sites for a function block where function blocks are to be arranged;

a first arrangement step of arranging function blocks in said sites for a function block; and a second arrangement step of arranging on-chip capacitors in said sites for an on-chip capacitor.

4. An element arrangement method for the semiconductor integrated circuit comprising; first wirings composed of a plurality of power supply and ground wirings running in a first direction; second wirings positioned under said first wirings, the second wirings being composed of a plurality of power supply and ground wirings which run in a second direction different from said first direction; first regions being below one of said first wirings and being between two adjacent wirings of said second wirings; and second regions being between two adjacent regions of said first regions and being between two adjacent wirings of said second wirings, each second region being smaller than a function block, said element arrangement method comprising:

a step of designating third regions, which consist of said first regions and said second regions, as sites for an on-chip capacitor where on-chip capacitors are to be arranged and other regions being between two adjacent wirings of said second wirings except for said first regions as sites for a function block where function blocks are to be arranged;

a first arrangement step of arranging function blocks in said sites for a function block; and a second arrangement step of arranging on-chip capacitors in said sites for an on-chip capacitor.

* * * * *